US008120080B2

(12) United States Patent
Park

(10) Patent No.: US 8,120,080 B2
(45) Date of Patent: Feb. 21, 2012

(54) IMAGE SENSOR AND MANUFACTURING METHOD OF IMAGE SENSOR

(75) Inventor: Jeong-Su Park, Gwanak-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 289 days.

(21) Appl. No.: 12/575,338

(22) Filed: Oct. 7, 2009

(65) Prior Publication Data

US 2010/0155872 A1 Jun. 24, 2010

(30) Foreign Application Priority Data

Dec. 24, 2008 (KR) ........................ 10-2008-0133662

(51) Int. Cl.

*H01L 31/062* (2006.01)
*H01L 31/113* (2006.01)
*H01L 27/148* (2006.01)
*H01L 29/768* (2006.01)
*H01L 31/06* (2006.01)
*H01L 31/00* (2006.01)

(52) U.S. Cl. ........ 257/292; 257/233; 257/461; 257/466; 257/E33.076

(58) Field of Classification Search .................. 257/233, 257/292, 461, 466, E33.076

See application file for complete search history.

(56) References Cited

U.S. PATENT DOCUMENTS

| | | | | |
|---|---|---|---|---|
| 5,987,196 | A * | 11/1999 | Noble | 385/14 |
| 7,126,102 | B2 * | 10/2006 | Inoue et al. | 250/214 R |
| 7,385,172 | B2 * | 6/2008 | Inoue et al. | 250/214 R |
| 7,615,399 | B2 * | 11/2009 | Lee | 438/70 |
| 7,709,780 | B2 * | 5/2010 | Inoue et al. | 250/214.1 |
| 7,755,122 | B2 * | 7/2010 | Lee | 257/294 |
| 2007/0007563 | A1 * | 1/2007 | Mouli | 257/292 |

* cited by examiner

*Primary Examiner* — Ida M Soward

(74) *Attorney, Agent, or Firm* — Sherr & Vaughn, PLLC

(57) ABSTRACT

An image sensor includes a trench formed in a semiconductor substrate, a first reflection part formed in the trench and having an inclined, curved surface, a second reflection part formed on the first reflection part such that a remaining space of the trench is filled with the second reflection part, and a vertical type photodiode formed on a region of the substrate between trenches. A method for forming the image sensor includes forming a trench in a semiconductor substrate, forming a first reflection part having an inclined, curved surface in the trench, forming a second reflection part on the first reflection part such that a remaining space of the trench is filled with the second reflection part, and forming a vertical type photodiode on a region of the substrate between trenches.

6 Claims, 4 Drawing Sheets

125
130
120
120
100
105
110

IMAGE SENSOR AND MANUFACTURING METHOD OF IMAGE SENSOR

The present application claims priority under 35 U.S.C. 119 to Korean Patent Application No. 10-2008-0133662 (filed on Dec. 24, 2008), which is hereby incorporated by reference in its entirety.

BACKGROUND

An image sensor is a semiconductor device to convert an optical image into an electric signal. Image sensors are mainly classified as charge coupled device (CCD) image sensors and complementary metal oxide silicon (CMOS) image sensors (CIS).

The CMOS image sensor employs a switching mode to sequentially detect an output by providing MOS transistors corresponding to the number of pixels. CMOS technology is capable of integrating peripheral devices, such as a control circuit and a signal processing circuit. The CMOS image sensor cell includes a photodiode and a plurality of MOS transistors.

Figure 1:
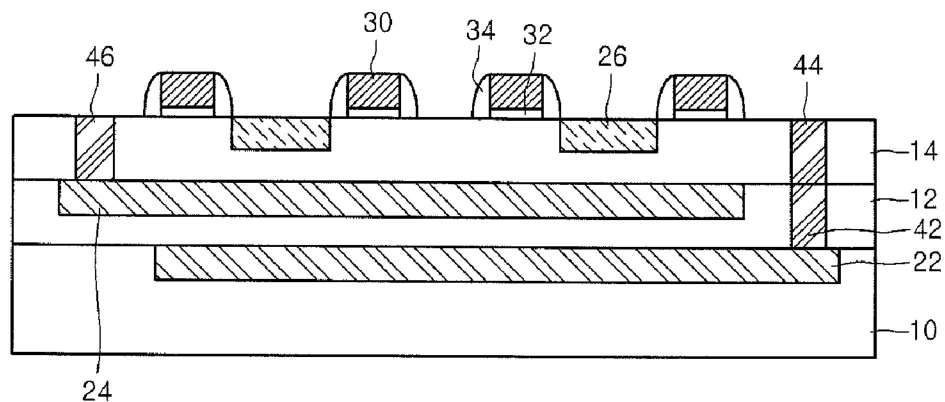

FIG. 1 is a sectional view showing a related CMOS image sensor. Referring to FIG. 1, an ion implantation process and a silicon epitaxial growth process are repeatedly performed with respect to a semiconductor substrate, such as a silicon substrate 10, thereby forming photodiodes 22, 24 and 26 for receiving red light, green light and blue light, respectively.

In detail, an ion implantation layer for the red photodiode 22 is formed in the substrate 10. Then, a first silicon epitaxial layer 12 is formed over the ion implantation layer. After that, the green photodiode 24 is formed in the first silicon epitaxial layer 12 through an ion implantation process. In addition, a plug 42 for a contact of the red photodiode 22 is formed at a predetermined portion of the first silicon epitaxial layer 12.

Then, the silicon epitaxial growth process is again performed to form a second silicon epitaxial layer 14. The blue photodiode 26 is formed in the second silicon epitaxial layer 14. In addition, a plug 46 for a contact of the green photodiode 24 and a plug 44 for a contact of the red photodiode 22 are formed in the second silicon epitaxial layer 14. A plurality of MOS transistors are formed on the second silicon epitaxial layer 14 to transfer photo charges collected in the photodiodes 22, 24 and 26. Each MOS transistor includes a gate 30, a gate insulating layer 32 and a spacer 34.

In such a CMOS image sensor, an area of the red photodiode 22 and the green photodiode 24 is larger than an area of the blue photodiode 26. However, since transfer transistors are aligned at the uppermost position and the blue photodiode 26 is positioned above the red and green photodiodes 24 and 26, the actual light receiving area of the red and green photodiodes 24 and 26 is significantly reduced.

In addition, since the plugs 42, 44 and 46 used for processing signals from the red photodiode 22 or the green photodiode 24 are formed thorough the ion implantation process, signal noise may occur in the plugs 42, 44 and 46 when external light is irradiated thereto.

Moreover, to prevent the red, green and blue photodiodes 22, 24 and 26 from interfering with each other, the red, green and blue photodiodes 22, 24 and 26 must be separated from each other. For this reason, an additional ion implantation layer must be formed in each epitaxial layer to isolate the red, green and blue photodiodes 22, 24 and 26 from each other.

SUMMARY

Embodiments relate to an image sensor and a method for manufacturing the same. Embodiments relate to an image sensor having a structure using light reflection and a method for manufacturing the same. In addition, embodiments provide an image sensor and a method for manufacturing the same, in which a manufacturing process for a CMOS image sensor can be simplified, a light receiving area can be maximized, and distance control between a substrate surface and a photodiode can be easily achieved.

The image sensor according to embodiments may include a semiconductor substrate defining a trench, a first reflection part formed in the trench and having an inclined, curved surface, a second reflection part formed over the first reflection part such that a remaining space of the trench is filled with the second reflection part, and a vertical type photodiode formed in a region of the substrate adjacent the trench.

The method for manufacturing the image sensor according to embodiments may include forming a trench in a semiconductor substrate, forming a first reflection part having an inclined, curved surface in the trench, forming a second reflection part over the first reflection part such that a remaining space of the trench is filled with the second reflection part, and forming a vertical type photodiode on a region of the substrate adjacent the trench.

DRAWINGS

FIG. 1 is a section view showing a related CMOS image sensor.

Figure 2:
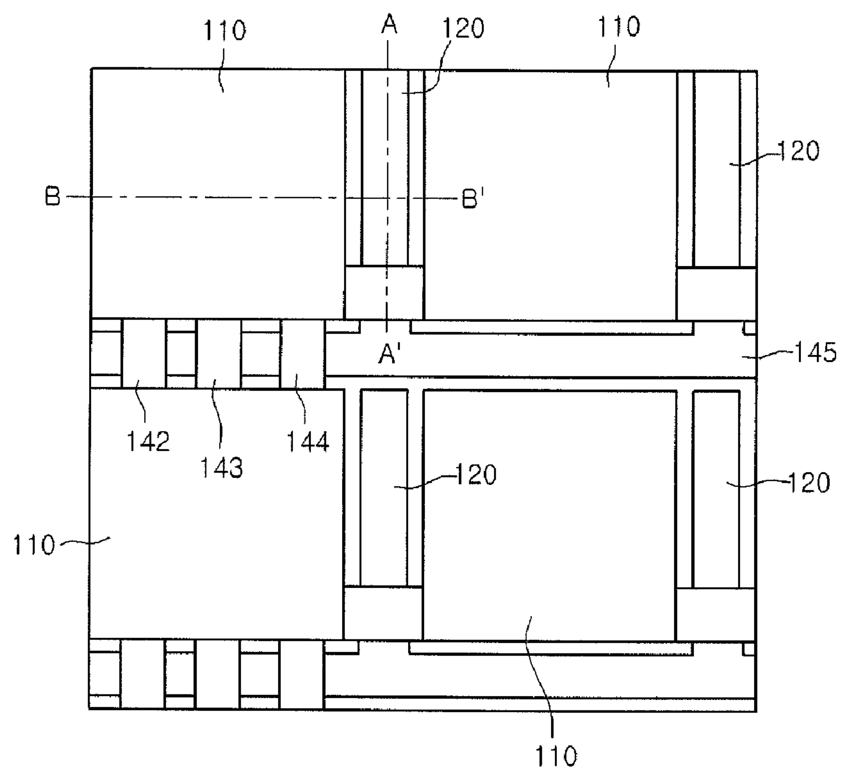

Example FIG. 2 is a plan view showing the structure of an image sensor according to embodiments.

Figure 3:
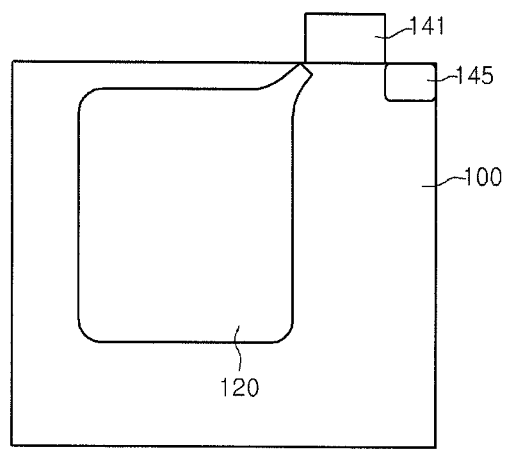

Example FIG. 3 is a side sectional view of an image sensor taken along line A-A' of example FIG. 2.

Figure 4:
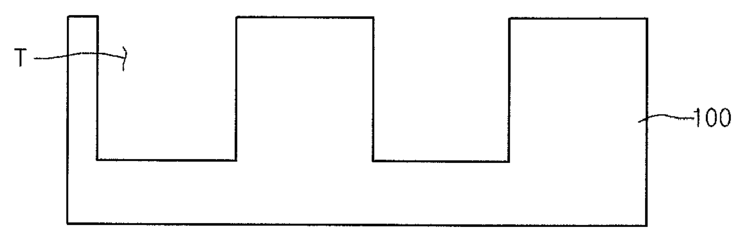

Example FIG. 4 is a side sectional view showing trenches formed in a semiconductor substrate according to embodiments.

Figure 5:
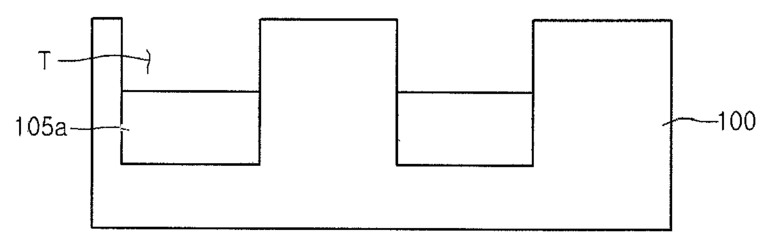

Example FIG. 5 is a side sectional view showing trenches of a semiconductor substrate filled with a first material solution according to embodiments.

Figure 6:
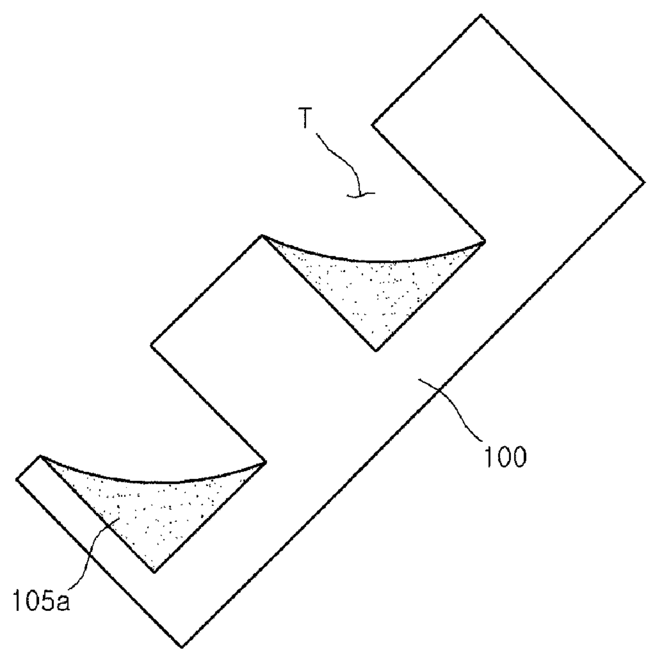

Example FIG. 6 is a side sectional view showing a semiconductor substrate being inclined according to embodiments.

Figure 7:
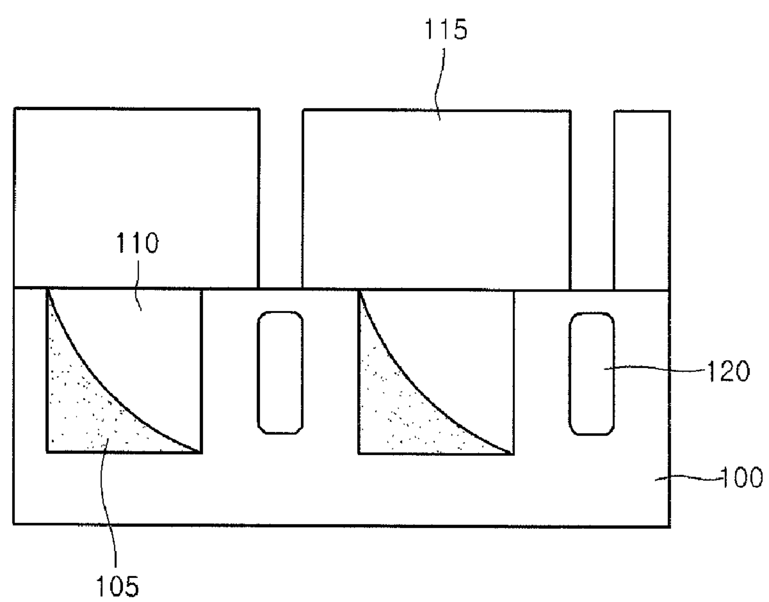

Example FIG. 7 is a side sectional view showing configuration of an image sensor after a photodiode has been formed according to embodiments.

Figure 8:
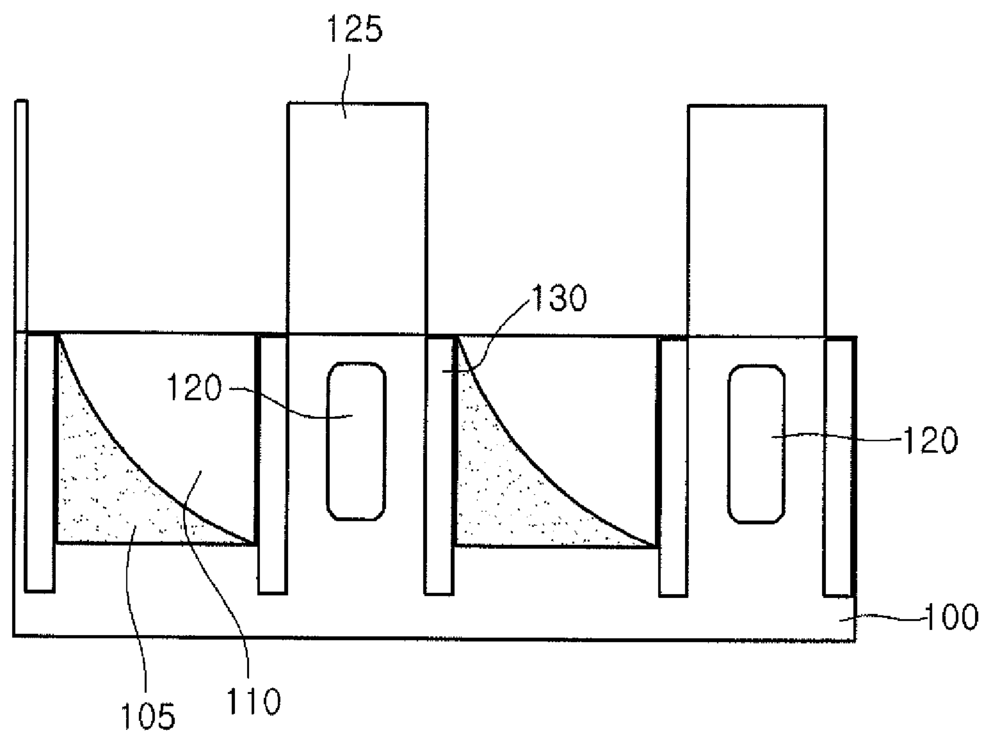

Example FIG. 8 is a side sectional view showing configuration of an image sensor after an isolation layer has been formed according to embodiments.

DESCRIPTION

Example FIG. 2 is a plan view showing the structure of the image sensor according to the embodiment, and example FIG. 3 is a side sectional view of the image sensor taken along line A-A' of example FIG. 2. The image sensor according to embodiments can improve light receiving efficiency by utilizing the total reflection function of a reflection area (second material layer) 110, which will be described later with reference to example FIGS. 3 to 8. Such a total reflection structure may facilitate the position adjustment for other components.

Referring to example FIGS. 2 and 3, when seen in plan view, a photodiode 120 and a gate 141 of a transfer transistor may be formed on the right of the reflection area 110 in a substrate. In addition, a plurality of transistors 142, 143 and 144, and a floating diffusion area 145, may be formed under the reflection area 110 in the substrate. The transistors 142, 143 and 144 may include a select transistor 142, an access transistor 143, and a reset transistor 144.

As shown in example FIG. 3, the photodiode 120 may be formed at one side the gate 141 of the transfer transistor and the floating diffusion layer 145 may be formed at the other side of the gate 141. The transfer transistor accumulates electric signals generated from the photodiode 120. The floating diffusion layer 145 stores the electric signals accumulated in the transfer transistor, and the reset transistor 144 applies power to the floating diffusion layer 145.

In addition, as the electric signal is stored in the floating diffusion layer 145, a gate potential may be changed so that the access transistor 143 applies an electric signal. At this time, the select transistor 142 outputs the electric signal applied from the access transistor 143.

Hereinafter, a method for manufacturing the image sensor according to embodiments will be described with reference to example FIGS. 4 to 8. Example FIGS. 4 to 8 are side sectional views of the image sensor taken along line B-B' of example FIG. 2. Example FIG. 4 is a side sectional view showing trenches T formed in a semiconductor substrate 100 according to embodiments.

Referring to example FIG. 4, trenches T may be formed in a semiconductor substrate 100, such as a silicon wafer. In particular, the trenches T may be formed in a P-type epitaxial layer of the semiconductor substrate, where the photodiode 110 will be formed later, at a predetermined depth, for example, 0.5 to 2.0 μm. The trenches T can be formed through a dry etching process. In embodiments, each trench T may have a square shape to maximize the area of a reflection layer, which will be formed later. The photodiode, an isolation layer, and the gate 141 of the transfer transistor may be formed at regions between the trenches T.

Example FIG. 5 is a side sectional view showing the trenches T of the semiconductor substrate 100 filled with a first material solution 105*a* according to embodiments. The first material solution 105*a* can be deposed in the trenches T through a spin coating scheme such that the level of the first material solution 105*a* does not exceed half the depth of trench T.

Example FIG. 6 is a side sectional view showing the semiconductor substrate 100 being inclined according to an embodiment. After the first material solution 105*a* has been deposed in the trenches T, the semiconductor substrate 100 may be inclined by a predetermined angle in the range of approximately 5 to 70° such that the first material solution 105*a* can be leveled in the diagonal direction of the trenches T. According to embodiments, the trench T has a rectangular shape, so the first material solution 105*a* can be leveled in the diagonal direction of the trenches T when the semiconductor substrate 100 is inclined at an angle of approximately 45° as shown in example FIG. 6. With the semiconductor substrate 100 in an inclined position, a baking process may be performed to cure the first material solution 105*a*. Thus, a first reflection area 105 (see, example FIG. 7) can be formed.

The first material solution 105*a* may include, for example, at least one of PAE (Poly Arylene Ether) and polyimide in a liquid phase. As shown in example FIG. 6, the surface of the first material solution 105*a* may be concave down during the curing process due to surface tension in the first material solution 105*a*. After the first material solution 105*a* has been cured, the semiconductor substrate 100 may be returned to its original position. That is, the semiconductor substrate 100 may be arranged horizontally again for the purpose of subsequent processes.

Example FIG. 7 is a side sectional view showing configuration of the image sensor after the photodiode 120 has been formed according to embodiments. If the first reflection area 105 has been formed, a second material solution may be deposed in the remaining space of the trench T and then the second material solution may be cured to form the second reflection area 110.

The second material solution may have a refractive index greater than that of the first material solution, and may include $SiO_2$. The second material solution may be filled in the trench T through a spin coating process.

Unlike the first reflection area 105, the second reflection area 100 does not need to have a concave reflection surface, so the second reflection area 100 may be formed through a CVD (chemical vapor deposition) process without performing the liquid coating and curing processes.

If the first reflection area 105 includes PAE or polyimide and the second reflection area 110 includes $SiO_2$, the refractive index of the first reflection area 105 may be about 80% of the refractive index of the second reflection area 110. In this case, light incident onto the top surface of the trench T passes through the second reflection area 110 having the higher reflective index and is totally reflected toward the sidewall of the trench T formed adjacent to the photodiode 120 without passing through the first reflection area 105.

If the second reflection area 110 has been formed, a photoresist coating process, a reticle alignment process and an exposure and development process may be performed, thereby forming a first photoresist pattern 115 that partially exposes the substrate between the trenches T. The photodiode may be formed in the region of the semiconductor substrate 100 exposed by the first photoresist pattern 115.

Then, a first ion implantation process may be performed by using the first photoresist pattern 115 as a mask, thereby forming the photodiode 120. For instance, during the first ion implantation process, ions, such as As or P, may be implanted in the rate of approximately $1.0\times10^{11}$ atom/cm$^2$ to $1.0\times10^{14}$ atom/cm$^2$ at an implantation angle of approximately 0 to 10° while supplying an ion implantation energy of 15 KeV to 1500 KeV. The photoresist pattern 115 may be removed after the photodiode 120 has been formed.

Example FIG. 8 is a side sectional view showing configuration of the image sensor after an isolation layer 130 has been formed according to embodiments. As shown in example FIG. 8, a second photoresist pattern 125 that defines the isolation layer 130 may be formed by performing a photoresist coating process, a reticle alignment process and an exposure and development process.

The second photoresist pattern 125 may be partially formed over the region of the semiconductor substrate 100 between the trenches T to partially expose both sides of the region of the semiconductor substrate 100 adjacent to the trenches T. Then, the isolation layer 130 may be formed by performing the second ion implantation process using the second photoresist pattern 125 as a mask.

For instance, during the second ion implantation process, ions, such as B or $BF_2$, may be implanted in the rate of approximately $1.0\times10^{11}$ atom/cm$^2$ to $1.0\times10^{13}$ atom/cm$^2$ while supplying ion implantation energy of 15 KeV to 500 KeV. In general, if an N-type photodiode makes contact with a defect existing in the sidewall of the trench T, noise may occur, and leakage current may be generated. To prevent the noise, the sidewall of the trench T must be spaced apart from the photodiode 120 by a predetermined distance. This distance may be a limitation in fabricating a small-sized image sensor. However, according to embodiments, the isolation layer 130 can isolate the sidewall of the trench T from the photodiode 120, so the width of the region of the semiconductor substrate 100 between the trenches T may be minimized. The second photoresist pattern 125 may be removed after the isolation layer 130 has been formed.

Meanwhile, the select transistor 142, the access transistor 143, the transfer transistor 141 and the reset transistor 144 may have the substantially same structure. Hereinafter, the structure of the above transistors will be briefly described with reference to example FIG. 2.

In the semiconductor substrate 100, the trenches are formed under the reflection area 110 and oxide is filled in the trenches, thereby forming plural isolation areas that define transistor areas. Then, an insulating layer and a polysilicon layer may be sequentially deposited over the semiconductor substrate 100 and the resultant structure may be etched by using the photoresist pattern as an etch mask, thereby forming the gate insulating layers and the gate electrodes that constitute the transistors. For instance, the transistors 142, 143, 144, and 141 may be realized as MOS transistors. In addition, a spacer, an LDD area and source/drain areas may be formed.

Then, the photoresist pattern that exposes the side regions of the transistors 142, 143, 144, and 141 in the substrate between the reflection areas 110 may be formed. An ion implantation process may be performed by using the photoresist pattern as a mask, thereby forming the floating diffusion layer 145.

After that, a metal interconnection process may be performed. The metal interconnection may be formed over the semiconductor substrate as well as over the photodiode 120 except for the reflection area 110. Therefore, the light incident into the semiconductor substrate 100 may be mostly blocked by the metal interconnection. That is, the light can be incident into the semiconductor substrate only through the reflection area 110.

That is, when the light is incident vertically to the surface of the semiconductor substrate 100, the reflection area 110 reflects the light in the horizontal direction, so that the reflected light is collected in the photodiode 120. Thus, the photodiode 120 generates the electric signal transferred to the gate of the transfer transistor.

Referring to example FIG. 2, two reflection areas 110, two photodiodes 120 and two transfer transistor gates 141 are prepared in the form of a pair to constitute one unit pixel, in which the two transfer transistor gates 141 share the floating diffusion layer 145 formed under the transfer transistor gates 141.

The signals generated from the two photodiodes 120 are alternately sampled by the transistors 142, 143 and 144 at a predetermined time interval. Such a sampling operation can be achieved according to the control signal of the select transistor 142.

Embodiments have at least the following advantages. First, embodiments can provide an image sensor having a new structure employing a light reflection and a method for manufacturing the same. Second, the light incident into the image sensor is reflected from the concave surface of the reflection area at various angles in the range of 5 to 70° such that the light can be collected in the photodiode. Thus, it is possible to install an obstacle that blocks the light over the photodiode and the device having a stack structure can be advantageously achieved.

Third, the light receiving area of the photodiode can be enlarged, so that the photo-conversion efficiency of the photodiode can be maximized. In addition, there is no need to form a plug through the complex ion implantation process to electrically connect the photodiode to the transistor. Forth, since the plug has a simple structure, signal noise caused by a relatively complicated structure of a plug can be prevented, and the performance of the image sensor can be improved.

Fifth, the distance between the light reflection surface and the photodiode may be adjusted by using the isolation layer, so that the size of the image sensor can be minimized and the position of each layer can be precisely controlled as compared with the related art that controls the position of the photodiode on the substrate by adjusting implantation energy.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. An image sensor comprising:

a semiconductor substrate defining a trench;

a first reflection part formed in the trench and having an inclined, curved surface;

a second reflection part formed over the first reflection part such that a remaining space of the trench is filled with the second reflection part; and a vertical type photodiode formed in a region of the substrate adjacent the trench.

2. The image sensor of claim 1, wherein the trench is formed in a P-type epitaxial layer on which the photodiode is formed later.

3. The image sensor of claim 1, wherein the first reflection part includes at least one of poly arylene ether and polyimide, and the second reflection part includes $SiO_2$.

4. The image sensor of claim 1, including:

a transfer transistor gate formed at a first lateral side of a reflection area including the first and second reflection parts such that the transfer transistor gate is connected to the photodiode formed at the first lateral side of the reflection area;

a plurality of transistors provided at a second lateral side of the reflection area, in which the second lateral side is adjacent to the first lateral side where the photodiode is formed; and a floating diffusion layer formed on a region of the semiconductor substrate between the transistors and the gate.

5. The image sensor of claim 1, wherein two reflection areas, two photodiodes and two transfer transistors are provided to constitute a unit pixel, and the two transfer transistor gates share a floating diffusion layer formed under the transfer transistor gates.

6. The image sensor of claim 5, wherein the transistor alternately samples signals, which are generated from the two photodiodes, at a predetermined time interval.

* * * * *